(12) United States Patent
Kondo et al.

(10) Patent No.: US 9,866,224 B2
(45) Date of Patent: Jan. 9, 2018

(54) OSCILLATOR, RADIO COMMUNICATION DEVICE, AND RADIO COMMUNICATION METHOD

(71) Applicant: KABUSHIKI KAISHA TOSHIBA, Minato-ku (JP)

(72) Inventors: Satoshi Kondo, Kawasaki (JP); Akihide Sai, Yokohama (JP); Masanori Furuta, Odawara (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/408,613

(22) Filed: Jan. 18, 2017

(65) Prior Publication Data

US 2017/0214409 A1    Jul. 27, 2017

(30) Foreign Application Priority Data

Jan. 22, 2016    (JP) .................. 2016-010780

(51) Int. Cl.
*H04B 1/06*    (2006.01)
*H03L 7/099*    (2006.01)
(Continued)

(52) U.S. Cl.
CPC ............ *H03L 7/099* (2013.01); *H03B 5/08* (2013.01); *H03L 7/087* (2013.01); *H04B 1/38* (2013.01); *H03B 2201/0208* (2013.01)

(58) Field of Classification Search
CPC ......... H03L 1/023; H03L 7/087; H03L 7/093; H03L 7/099; H03B 5/08; H03B 5/1243; H03B 2201/0208; H04B 1/38
(Continued)

(56) References Cited

U.S. PATENT DOCUMENTS 3,496,473 A * 2/1970 Fruehsamer ............ H03J 5/244
                                                              331/18
6,127,900 A * 10/2000 Laub ....................... H03J 5/244
                                                           331/177 V
(Continued)

OTHER PUBLICATIONS

Robert Bogdan Staszewski et al., "All-Digital PLL and Transmitter for Mobile Phones", IEEE Journal of Solid-State Circuits, vol. 40, No. 12, Dec. 2005, pp. 7.
(Continued)

*Primary Examiner* — Quochien B Vuong
(74) *Attorney, Agent, or Firm* — Oblon, McClelland, Maier & Neustadt, L.L.P.

(57) ABSTRACT

An oscillator has an oscillator which comprises a first variable capacitor to adjust capacitance based on a first signal and a second variable capacitor to adjust capacitance, generates an oscillation signal having a frequency in accordance with the capacitance of the first variable capacitor and the second variable capacitor, an integer phase detector to detect an integer phase of the oscillation signal, a fractional phase detector to detect a fractional phase of the oscillation signal, a phase error generator to generate a fourth signal indicating a phase error of the oscillation signal, a first filter to extract the first signal in a predetermined frequency band, included in the fourth signal, and to output the first signal, and a second filter to extract the second signal in a predetermined frequency band, included in the fourth signal, and to output the second signal.

20 Claims, 7 Drawing Sheets

(51) Int. Cl.
*H03L 7/087* (2006.01)
*H03B 5/08* (2006.01)
*H04B 1/38* (2015.01)

(58) Field of Classification Search
USPC ......... 455/73, 255, 260, 265, 316, 318, 334;
331/18, 25, 34, 36 R, 177 R, 181;
375/373, 376
See application file for complete search history.

(56) References Cited

U.S. PATENT DOCUMENTS

| | | | | |
|---|---|---|---|---|
| 6,778,022 | B1 * | 8/2004 | Zhang | ...................... H03L 7/099 |
| | | | | 331/117 FE |
| 7,375,593 | B2 * | 5/2008 | Self | .......................... H03K 5/14 |
| | | | | 331/16 |
| 7,432,769 | B2 * | 10/2008 | Kato | ....................... H03L 7/099 |
| | | | | 455/260 |
| 7,511,582 | B2 * | 3/2009 | Yin | ......................... H03L 7/099 |
| | | | | 331/16 |
| 8,742,808 | B2 | 6/2014 | Staszewski et al. | |

OTHER PUBLICATIONS

Ping-Ying Wang et al., "A Digital Intensive Fractional-N PLL and All-Digital Self-Calibration Schemes," IEEE Journal of Solid-State Circuits, vol. 44, No. 8, Aug. 2009, pp. 11.

\* cited by examiner

FIG. 3A
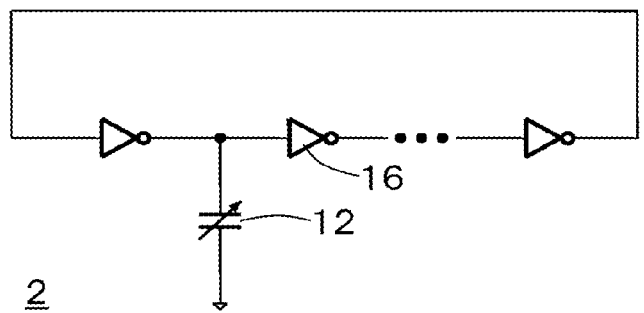
2
FIG. 3B
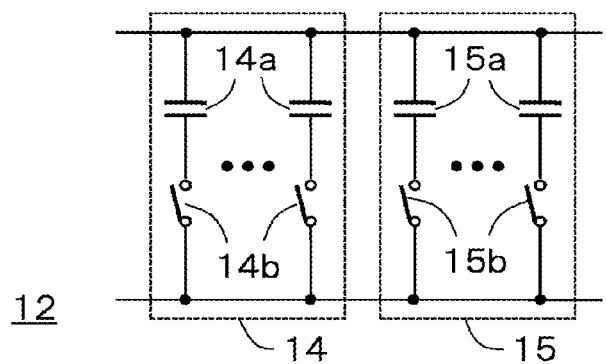
12
FIG. 4
7

OSCILLATOR, RADIO COMMUNICATION DEVICE, AND RADIO COMMUNICATION METHOD

CROSS REFERENCE TO RELATED APPLICATIONS

This application is based upon and claims the benefit of priority from the prior Japanese Patent Application No. 2016-10780, filed on Jan. 22, 2016, the entire contents of which are incorporated herein by reference.

FIELD

Embodiments of the present disclosure relate to an oscillator, a radio communication device, and a radio communication method.

BACKGROUND

Typically, a phase locked loop (PLL) circuit having a wide loop bandwidth, has an advantage in that tolerance for external noise is strong and PLL control can be performed with high precision in a wide band. In a case where the loop bandwidth of the PLL circuit is designed to be wide, minimizing delay time of a loop is important in order to secure a phase margin, sufficiently.

However, delay time tends to increase due to a lock circuit that performs phase error calculation and filter processing, in a digital PLL circuit. Therefore, a configuration having a wideband PLL circuit has been proposed by adding a phase frequency detector (PFD) and an analog filter to generate a low delayed signal path.

However, a problem occurs that a circuit area and power consumption increase when the phase frequency detector and the analog filter, both including analog elements, are added inside the digital PLL circuit. Another problem occurs that calibration is required, before operation of the digital PLL circuit, in order to prevent a filter characteristic from shifting from a desired value due to a variation of an electrical characteristic of the analog element, and thus time and labor are required for maintenance. Accordingly, it takes time to operate the digital PLL circuit and a further increase of the power consumption occurs.

BRIEF DESCRIPTION OF THE DRAWINGS

FIG. 3A is an equivalent circuit diagram of still another exemplary specific circuit configuration of the oscillating unit;

FIG. 3B is a circuit diagram of an exemplary specific configuration of a variable capacitor in FIG. 3A;

FIG. 4 is a block diagram of an exemplary internal configuration of a second filter;

DETAILED DESCRIPTION

According to one embodiment, an oscillator comprising:

an oscillator which comprises a first variable capacitor to adjust capacitance based on a first signal and a second variable capacitor to adjust capacitance based on a second signal, generates an oscillation signal having a frequency in accordance with the capacitance of the first variable capacitor and the second variable capacitor;

an integer phase detector to detect an integer phase of the oscillation signal;

a fractional phase detector to detect a fractional phase of the oscillation signal based on a third signal as a reference and the oscillation signal;

a phase error generator to generate a fourth signal indicating a phase error of the oscillation signal, based on the integer phase, the fractional phase, and a frequency control signal;

a first filter to extract the first signal in a predetermined frequency band, included in the fourth signal, and to output the first signal in asynchronization with the third signal; and a second filter to extract the second signal in a predetermined frequency band, included in the fourth signal, and to output the second signal in synchronization with the third signal.

Embodiments of the present disclosure will be described below with reference to the drawings.

First Embodiment

Figure 1:
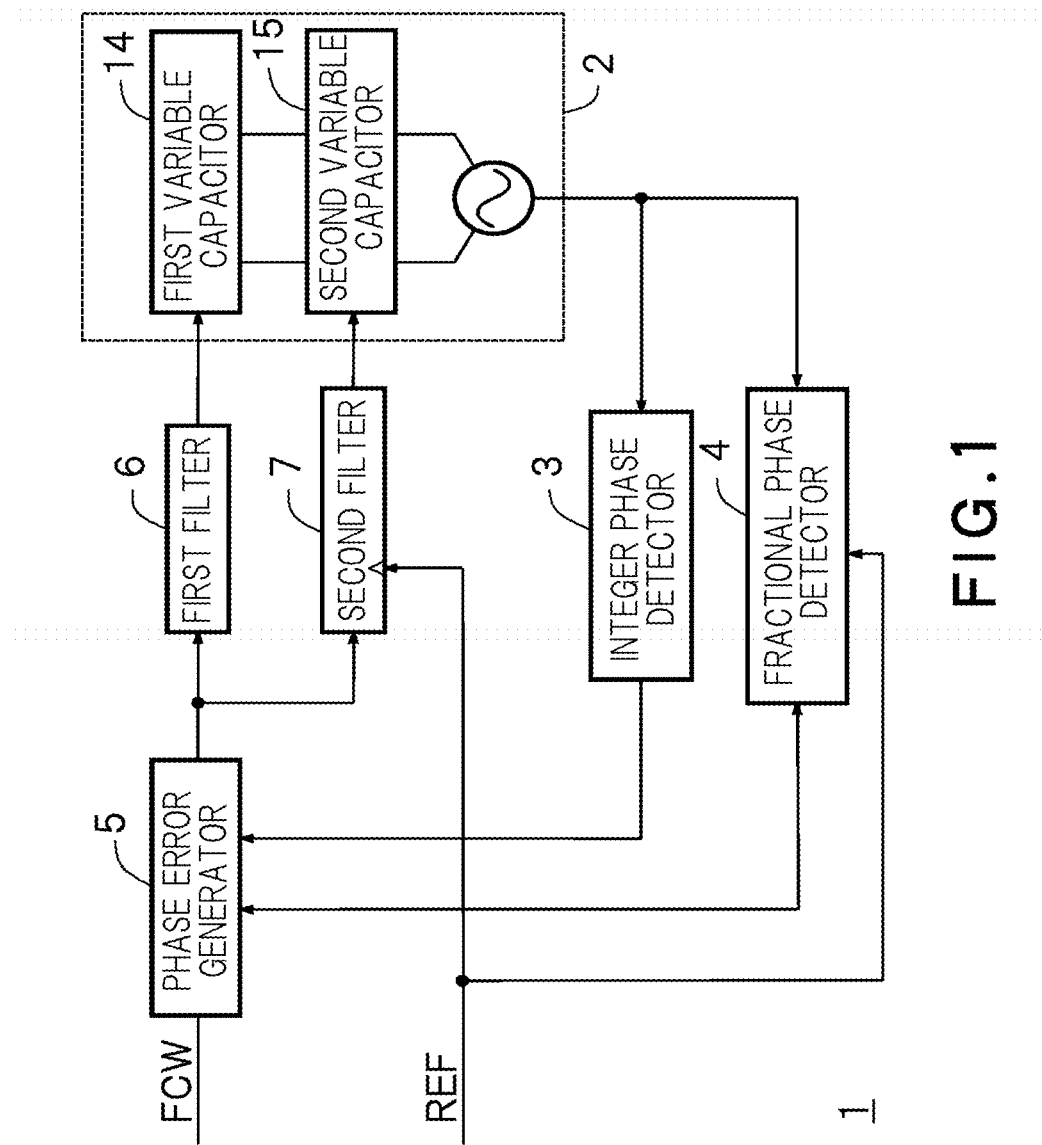
FIG. 1 is a block diagram of a schematic configuration of an oscillator according to a first embodiment.

FIG. 1 is a block diagram of a schematic configuration of an oscillator 1 according to a first embodiment. The oscillator 1 in FIG. 1 can be used as a local oscillator for a radio communication device, such as a receiver or a transmitter. Note that, the use of the oscillator 1 in FIG. 1 is not limited to the radio communication device.

The oscillator 1 in FIG. 1 includes an oscillating unit 2, an integer phase detector 3, a fractional phase detector 4, a phase error generator 5, a first filter 6, and a second filter 7. Each of the units inside the oscillator 1 in FIG. 1 totally includes a digital circuit. That is, the oscillator 1 in FIG. 1 is an all digital phase locked loop (ADPLL) circuit that performs PLL control of an oscillation signal.

Figure 2A:
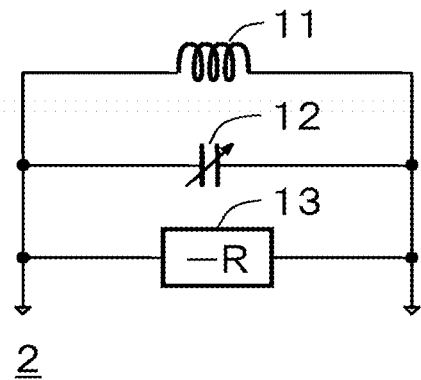
FIG. 2A is an equivalent circuit diagram of an exemplary specific circuit configuration of an oscillating unit.
Figure 2B:
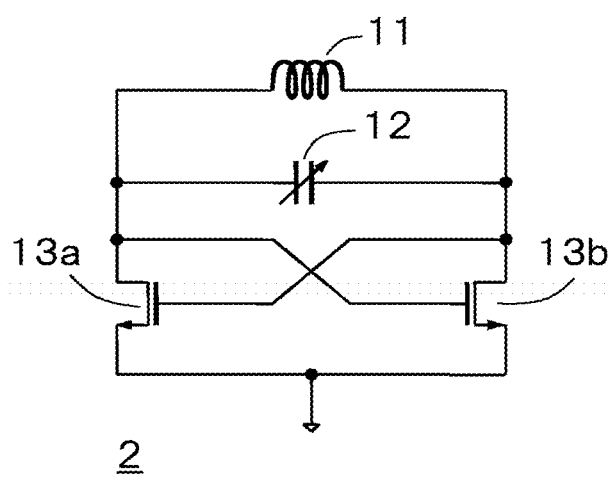
FIG. 2B is an equivalent circuit diagram of another exemplary specific circuit configuration of the oscillating unit.

The oscillating unit 2 is a digital controlled oscillator (DCO). FIG. 2A is an equivalent circuit diagram of an exemplary specific configuration of the oscillating unit 2. In FIG. 2A, an oscillation principle referred to as an LC-VCO is used, and a circuit including an inductor 11, a variable capacitor 12, and a negative resistor 13 coupled in parallel, is provided. As illustrated in FIG. 2B, the negative resistor 13 may include two MOS transistors 13a and 13b coupled cross.

Figure 2C:
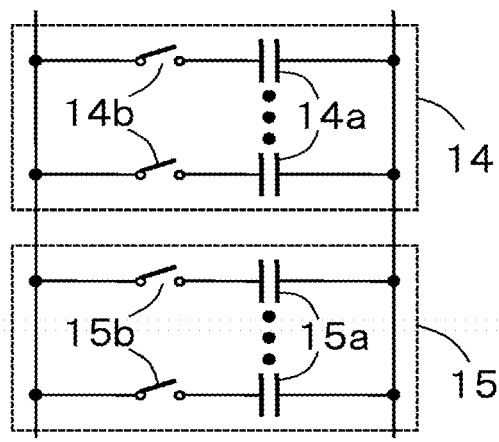
FIG. 2C is a circuit diagram of an exemplary specific configuration of a variable capacitor in FIG. 2A.

As illustrated in FIG. 2C, the variable capacitor 12 in FIG. 2A includes a first variable capacitor 14 and a second variable capacitor 15 coupled in parallel.

The first variable capacitor 14 includes a plurality of first capacitive elements 14a coupled in parallel and a plurality of first switches 14b that is individually coupled in series with each of the plurality of first capacitive elements 14a and is turned on or off with a first signal. Similarly, a second variable capacitor 15 includes a plurality of second capacitive elements 15a coupled in parallel and a plurality of second switches 15b that is individually coupled to each of the plurality of second capacitive elements 15a and is turned on or off with a second signal.

As described below, the plurality of first switches 14b in the first variable capacitor 14 is individually turned on or off with the first signal so that the first signal can switch capacitance of the first variable capacitor 14 in a plurality of ways. Similarly, the plurality of second switches 15b in the second variable capacitor 15 is individually turned on or off with the second signal so that the second signal can switch capacitance of the second variable capacitor 15 in a plurality of ways. Accordingly, the capacitance of the first variable capacitor 14 is variably controlled with the first signal output from the first filter 6. Similarly, the capacitance of the second variable capacitor 15 is variably controlled with the second signal output from the second filter 7.

An oscillation frequency of the oscillation signal output from the DCO 2 can be controlled with the capacitance of the first variable capacitor 14 or can be also controlled with the capacitance of the second variable capacitor 15. That is, the oscillation signal output from the DCO 2 has the oscillation frequency controlled by PLL control by the first filter 6 and the first variable capacitor 14 and additionally has the oscillation frequency controlled by PLL control by the second filter 7 and the second variable capacitor 15.

Since the first filter 6 operates in asynchronization with a reference signal REF, there is a risk that the first signal output from the first filter 6 includes a glitch. When the first signal includes the glitch, there is a risk that the capacitance of the first variable capacitor 14 suddenly varies and then operation of the DCO 2 becomes unstable.

Therefore, according to the present embodiment, the capacitance of the first variable capacitor 14 is made to be smaller than the capacitance of the second variable capacitor 15. Making the capacitance of the first variable capacitor 14 smaller than the capacitance of the second variable capacitor 15, prevents the risk that the operation of the DCO 2 becomes unstable, even when influence of the glitch included in the first signal provisionally varies the capacitance of the first variable capacitor 14.

Note that the circuit configuration of the oscillating unit 2 is not limited to that illustrated in FIG. 2A. FIG. 3A is a circuit diagram of the oscillating unit 2 according to one modification. In FIG. 3A, another oscillation principle referred to as a ring VCO is used, and a plurality of inverters 16 cascade-coupled in a ring and a variable capacitor 12 coupled to an interstage between arbitrary inverters 16, are provided. As illustrated in FIG. 3B, the variable capacitor 12 in FIG. 3A includes a first variable capacitor 14 and a second variable capacitor 15 coupled in parallel between an output terminal of a first inverter 16 out of the arbitrary inverters 16 and a ground node. Internal configurations of the first variable capacitor 14 and the second variable capacitor 15 are the same as those in FIG. 2C. Also in the oscillating unit 2 in FIG. 3A, the first signal and the second signal vary capacitance of the first variable capacitor 14 and the second variable capacitor 15 so that an oscillation frequency of an oscillation signal can be variably controlled.

The integer phase detector 3 in FIG. 1 detects and outputs an integer phase of the oscillation signal. The integer phase detector 3 includes a counter not illustrated, and counts the number of cycles of the oscillation signal with the counter. Then, a value of the count results in the integer phase.

The fractional phase detector 4 is a time to digital converter (TDC) that detects and outputs a fractional phase of the oscillation signal based on a third signal being reference (also referred to as the reference signal REF) and the oscillation signal. The fractional phase detector 4 detects and outputs, as the fractional phase, a phase difference between the oscillation signal and the reference signal REF.

The phase error generator 5 generates and outputs a fourth signal indicating a phase error of the oscillation signal, based on the integer phase, the fractional phase, and a frequency control signal FCW input from the outside.

The first filter 6 extracts the first signal in a predetermined frequency band, included in the fourth signal, and outputs the first signal in asynchronization with the reference signal REF. That is, the first filter 6 performs processing of extracting the first signal in asynchronization with the reference signal REF. The asynchronization with the reference signal REF shortens time necessary to pass through the first filter 6, and can also inhibit a variation of a phase due to the pass through the first filter 6. The frequency band extracted by the first filter 6 is, for example, approximately one tenth of the frequency of the reference signal REF.

The second filter 7 extracts the second signal in a predetermined frequency band, included in the fourth signal, and outputs the second signal in synchronization with the reference signal REF. That is, the second filter 7 performs processing of extracting the second signal in synchronization with the reference signal REF. The synchronization with the reference signal REF makes time necessary to pass through the second filter 7, longer than the time necessary to pass through the first filter 6, and makes a variation of a phase due to the pass through the second filter 7 larger than the variation of the phase due to the pass through the first filter 6.

The frequency band extracted by the first filter 6 is wider than the frequency band extracted by the second filter 7, and additionally the first filter 6 performs the asynchronization with the reference signal REF, whereas the second filter 7 performs the synchronization with the reference signal REF.

FIG. 4 is a block diagram of an exemplary internal configuration of the second filter 7. The second filter 7 in FIG. 4 includes a filtering unit 7a and a synchronizing unit 7b. The filtering unit 7a can be configured similarly to the first filter 6. Thus, the filtering unit 7a passes a signal in the same frequency band as that of the first filter 6, therethrough. The synchronizing unit 7b synchronizes the signal that has passed through the filtering unit 7a, with the reference signal REF, and then outputs the signal as the second signal. In this manner, a difference between the first filter 6 and the second filter 7 is whether the output signal after the filtering is synchronized with the reference signal REF.

Next, operation of the oscillator 1 in FIG. 1 will be described. In the oscillator 1 in FIG. 1, the integer phase detector 3 detects the integer phase of the oscillation signal output from the DCO 2 and additionally the fractional phase detector 4 detects the fractional phase of the oscillation signal. The detected integer phase and fractional phase are input to the phase error generator 5. Based on the integer phase, the fractional phase, and the frequency control signal FCW input from the outside, the phase error generator 5 generates the fourth signal indicating the phase error of the oscillation signal, and supplies the fourth signal to the first filter 6 and the second filter 7.

The first filter 6 extracts the first signal in the predetermined frequency band, included in the fourth signal, and outputs the first signal remaining. The second filter 7 extracts the second signal in the predetermined frequency band, included in the fourth signal, and outputs the second signal in synchronization with the reference signal REF. In this manner, the first signal is in asynchronization with the reference signal REF, whereas the second signal is in synchronization with the reference signal REF. Therefore, signal delay time from the input of the fourth signal to the first filter 6 to the output of the first signal, is shorter than signal delay time from the input of the fourth signal to the second filter 7 to the output of the second signal. That is, this means that the variation of the phase due to the pass of the fourth signal through the first filter 6 is smaller than the variation of the phase due to the pass through the second filter 7. In other words, the first filter 6 has a degree of phase margin larger than that of the second filter 7.

The first signal output from the first filter 6 is used to variably control the capacitance of the first variable capacitor 14 in the DCO 2. Similarly, the second signal output from the second filter 7 is used to control the capacitance of the second variable capacitor 15 in the DCO 2, variably.

The oscillation frequency of the oscillation signal output from the DCO 2 can be variably controlled by the capacitance of the first variable capacitor 14 or can be also controlled by the capacitance of the second variable capacitor 15. Since the first signal is in asynchronization with the reference signal REF, the first signal is output with timing faster than that of the second signal. Thus, the capacitance of the first variable capacitor 14 varies more promptly than the capacitance of the second variable capacitor 15. Note that, there is a risk that the first signal includes the glitch because of the asynchronization with the reference signal REF, and thus the capacitance of the first variable capacitor 14 easily varies. However, according to the present embodiment, since the capacitance of the first variable capacitor 14 is smaller than the capacitance of the second variable capacitor 15, there is few risk that the oscillation frequency of the oscillation signal output from the DCO 2 is influenced by the temporarily variation of the capacitance of the first variable capacitor 14.

According to the present embodiment, since the first filter 6 that operates in asynchronization with the reference signal REF, and the first variable capacitor 14 are provided, it is possible to promptly and variably control the oscillation frequency of the oscillation signal in response to the phase error of the oscillation signal so that wideband operation having a large degree of the phase margin can be performed. Even if the oscillation frequency of the oscillation signal provisionally, considerably varies, the second signal output from the second filter 7 can considerably vary the capacitance of the second variable capacitor 15 so that a large variation of the oscillation frequency of the oscillation signal can be handled. Since the large variation of the oscillation frequency of the oscillation signal typically occurs in a low cycle, the control of the capacitance of the second variable capacitor 15 with the second signal output from the second filter 7 that operates in synchronization with the reference signal REF, can handle the large variation of the oscillation frequency of the oscillation signal. That is, the PLL control of the oscillation signal by the first filter 6 and the first variable capacitor 14 is wideband control, whereas the PLL control of the oscillation signal by the second filter 7 and the second variable capacitor 15 is narrowband control.

In this manner, according to the present embodiment, the first filter 6 that operates in asynchronization with the reference signal REF, the first variable capacitor 14, the second filter 7 that operates in synchronization with the reference signal REF, and the second variable capacitor 15 are provided and the capacitance of the first variable capacitor 14 is smaller than the capacitance of the second variable capacitor 15. Thus, by using the first filter 6 and the first variable capacitor 14, it is possible to promptly control the oscillation frequency of the oscillation signal in response to the phase error of the oscillation signal so that the wideband is possible. With respect to the large variation of the oscillation frequency of the oscillation signal, it is possible to control the oscillation frequency of the oscillation signal by using the second filter 7 in synchronization with the reference signal REF.

All the elements in the oscillator 1 according to the present embodiment can be configured by the digital circuit so that a circuit area and power consumption can be reduced and costs of the elements can be also reduced.

Second Embodiment

The first filter 6 can pass the signal therethrough at a speed higher than that of the second filter 7 because of the operation in asynchronization with the reference signal REF, but the first signal, being output of the first filter 6, may include the glitch. A second embodiment to be described below is to reduce the glitch of the first signal.

Figure 5:
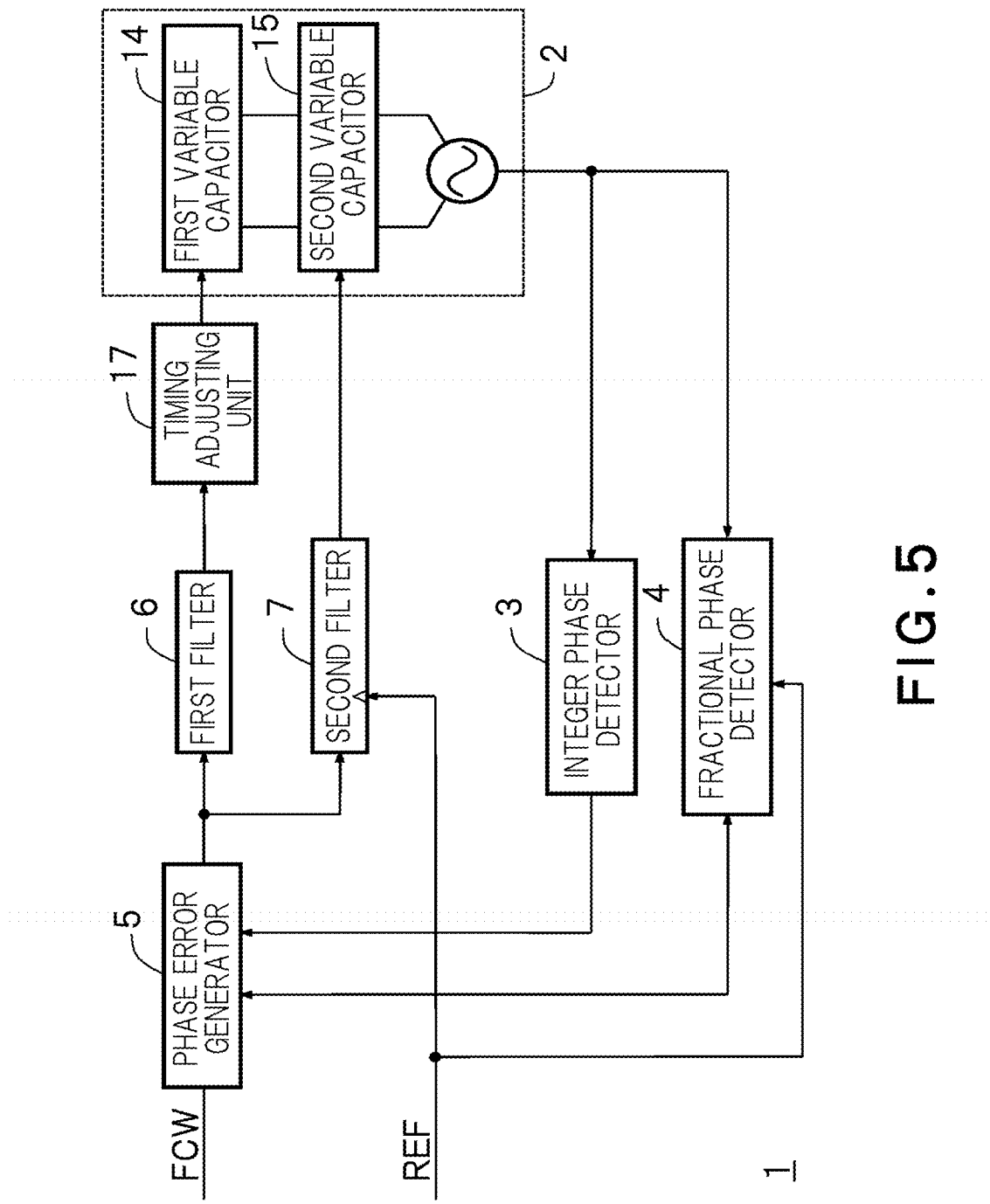
FIG. 5 is a block diagram of a schematic configuration of an oscillator according to a second embodiment.

FIG. 5 is a block diagram of a schematic configuration of an oscillator 1 according to a second embodiment. The oscillator 1 in FIG. 5 includes the configuration of the oscillator 1 in FIG. 1, and additionally includes a timing adjusting unit 17. The timing adjusting unit 17 is interposed between the first filter 6 and the first variable capacitor 14. The timing adjusting unit 17 generates and outputs a fifth signal including the amount of delay of the first signal adjusted. The first variable capacitor 14 adjusts the capacitance based on the fifth signal.

The timing adjusting unit 17 sets the amount of delay of the first signal so as to minimize the amount of the glitch included in the first signal. Note that, in order for the first filter 6 to utilize a feature of the operation more promptly than the second filter 7, the timing adjusting unit 17 preferably sets the amount of delay to be time shorter than signal propagation time of the second filter 7.

In this manner, the first variable capacitor 14 controls the capacitance based on the fifth signal including the amount of delay of the first signal output from the first filter 6, adjusted by the timing adjusting unit 17 so that occurrence of the glitch can be inhibited and the oscillation frequency of the oscillation signal can be adjusted even when the first filter 6 that operates in asynchronization with the reference signal REF is used.

Third Embodiment

The first filter 6 and the first variable capacitor 14 in the oscillator 1 according to the first embodiment, promptly control the oscillation frequency of the oscillation signal in response to a small phase error. When the phase error output from the phase error generator 5 increases, the PLL control cannot be correctly performed and a functional error occurs so that there is a risk that the PLL control cannot be normally performed. A third embodiment to be described below is to solve this type of malfunction.

Figure 6:
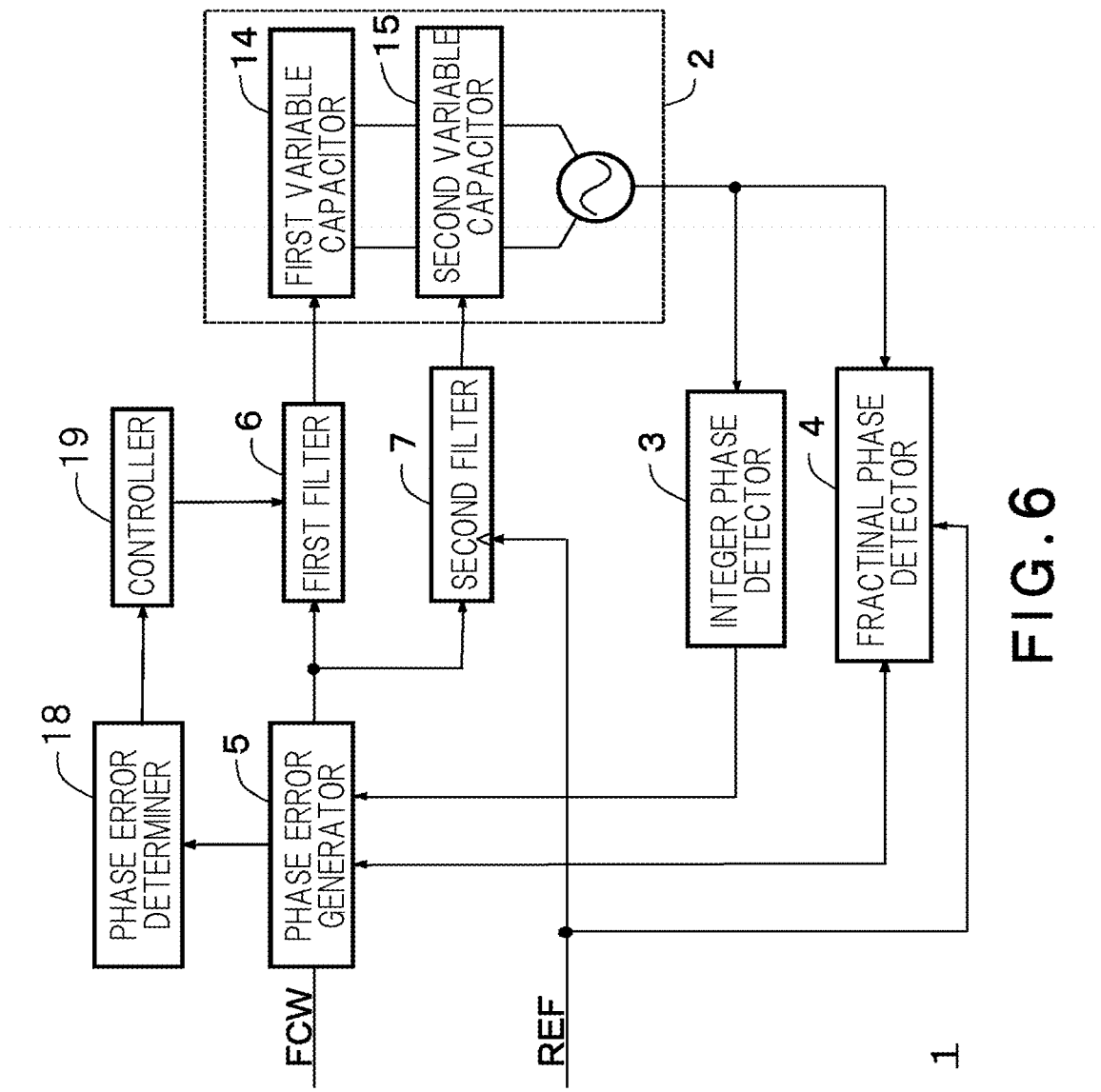
FIG. 6 is a block diagram of a schematic configuration of an oscillator according to a third embodiment.

FIG. 6 is a block diagram of a schematic configuration of an oscillator 1 according to the third embodiment. The oscillator 1 in FIG. 6 includes the configuration of the oscillator 1 in FIG. 1 and additionally includes a phase error determiner 18 and a control unit (controller) 19.

The phase error determiner 18 determines whether an absolute value of the phase error has exceeded a predetermined value, based on the fourth signal indicating the phase error output from the phase error generator 5.

The control unit 19 does not perform capacitance adjustment of the first variable capacitor 14 with the first signal output from the first filter 6, and performs capacitance adjustment of the second variable capacitor 15 with the second signal so as to control the oscillation frequency of the oscillation signal, until the phase error determiner 18 determines that the predetermined value has been exceeded. The control unit 19 performs the capacitance adjustment of the first variable capacitor 14 with the first signal and the capacitance adjustment of the second variable capacitor 15 with the second signal when the phase error determiner 18 determines that the predetermined value has been exceeded.

Immediately after the oscillator 1 starts oscillation operation, the operation is unstable and there is a risk that the phase error generator 5 outputs the fourth signal indicating a large phase error. Since the capacitance of the first variable capacitor 14 coupled to the first filter 6 is smaller than the capacitance of the second variable capacitor 15, the PLL control cannot performed in response to the large phase error and there is a risk that the functional error occurs. When the functional error occurs, the PLL control of the oscillation signal of the DCO 2 by using the first filter 6 and the first variable capacitor 14 cannot be normally performed. Accordingly, the phase error determiner 18 determines whether the phase error generator 5 has generated the large phase error, immediately after the oscillator 1 starts the oscillation operation. Based on a result of the determination of the phase error determiner 18, the control unit 19 suspends the PLL control of the oscillation signal by using the first filter 6 and the first variable capacitor 14 and performs the PLL control of the oscillation signal by using the second filter 7 and the second variable capacitor 15 until the phase error decreases. The second variable capacitor 15 can considerably, variably control the capacitance, and thus can control the oscillation frequency of the oscillation signal without the function error occurred even when the phase error is large.

Meanwhile, when the phase error decreases, the control unit 19 collectively performs the PLL control of the oscillation signal by the first filter 6 and the first variable capacitor 14, similarly to the first embodiment. Accordingly, the oscillator 1 can be achieved so as to be wideband.

Note that, the timing adjusting unit 17 may be interposed between the first filter 6 and the first variable capacitor 14 in FIG. 6, similarly to FIG. 5.

In this manner, according to the third embodiment, when the phase error has exceeded the predetermined value, the PLL control of the oscillation signal by using the second filter 7 and the second variable capacitor 15 is performed without the PLL control of the oscillation signal by using the first filter 6 and the first variable capacitor 14, and when the phase error is the predetermined value or less, both of the PLL controls are performed, so that the operation of the oscillator 1 can be stable without the function error indicating that the PLL control cannot be normally performed. In addition, when the phase error is the predetermined value or less, the same effect as that of the first embodiment is acquired.

Fourth Embodiment

Figure 7:
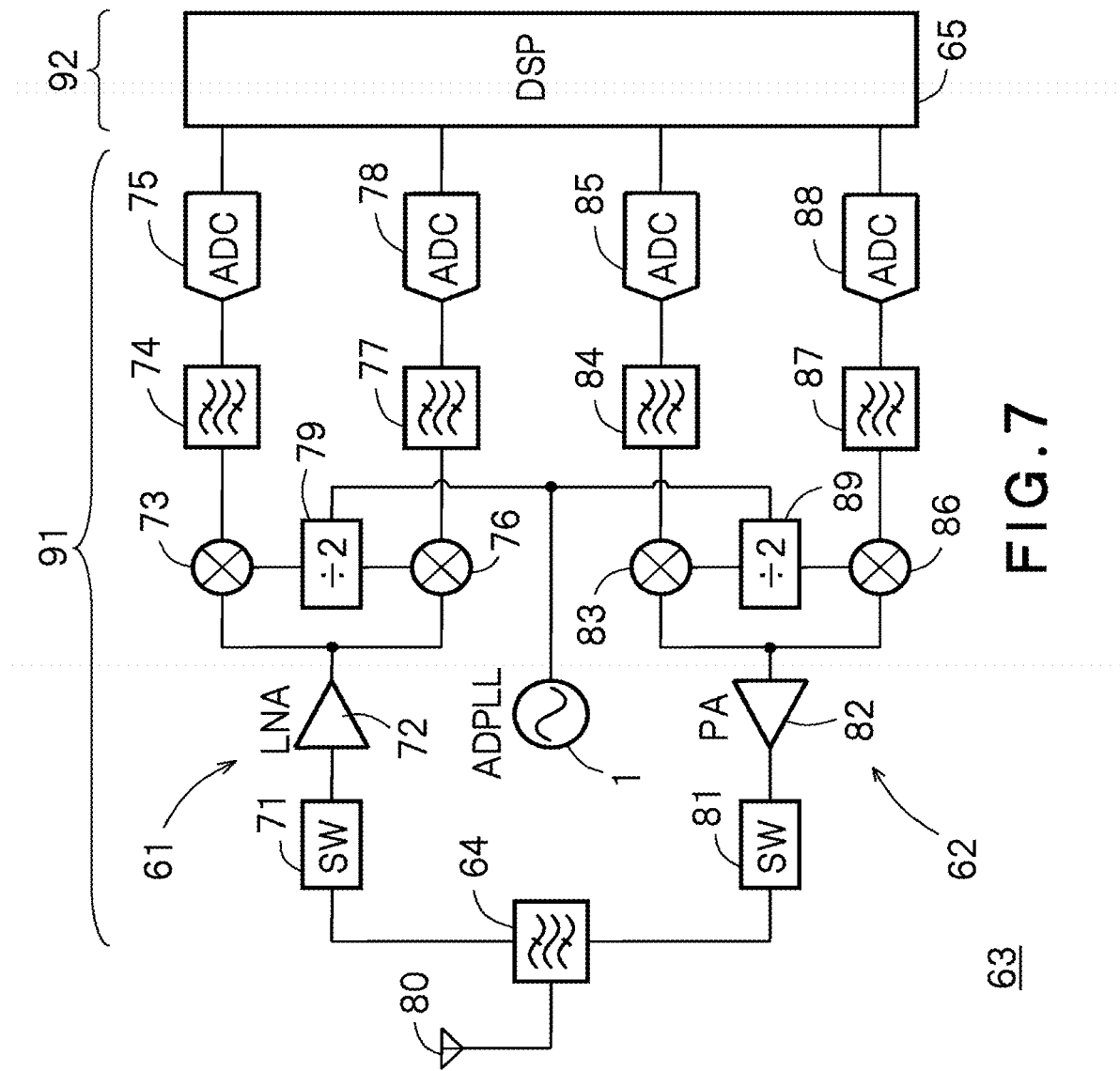
FIG. 7 is a block diagram of an internal configuration of a radio communication device including a phase lock circuit.

The above oscillators 1 according to the first to third embodiments can be used in a radio communication device 63 including a receiving circuit 61 or the receiving circuit 61 and a transmitting circuit 62. FIG. 7 is a block diagram of an internal configuration of the radio communication device 63 including the receiving circuit 61 having an oscillator 1 having any one of the ADPLL configurations according to the first to third embodiments.

The radio communication device 63 in FIG. 7 includes an RF unit 91 and a baseband unit 92. The RF unit 91 includes the transmitting circuit 62, the receiving circuit 61, the oscillator 1 that generates a local oscillation signal to be shared by the transmitting circuit 62 and the receiving circuit 61, and a bandpass filter (BPF) 64 coupled to an antenna unit 80. The baseband unit 92 includes a signal processing unit (DSP) 65 that performs baseband processing. The oscillator 1 in FIG. 7 is configured similarly to any one of the oscillators described in the first to third embodiments. The entire radio communication device 63 in FIG. 7 can include an integrated circuit (IC) on one chip. Alternatively, the radio communication device 63 in FIG. 7 may include a plurality of chips. For example, the RF unit 91 and the baseband unit 92 each may include a separate chip, the RF unit 91 may include a plurality of chips, or the baseband unit 92 may include a plurality of chips.

The receiving circuit 61 includes a transmission-and-reception changeover switch 71, a low noise amplifier (LNA) 72, an I signal reception mixer (MIX) 73, a low pass filter (LPF) 74, an A/D converter (ADC) 75, a Q signal reception mixer (MIX) 76, a low pass filter (LPF) 77, an A/D converter (ADC) 78, and a frequency divider 79 that frequency-divides the local oscillation signal from the oscillator 1.

The transmitting circuit 62 includes a transmission-and-reception changeover switch 81, a power amplifier (PA) 82, an I signal transmission mixer (MIX) 83, a low pass filter (LPF) 84, a D/A converter (DAC) 85, a Q signal transmission mixer (MIX) 86, a low pass filter (LPF) 87, a D/A converter (DAC) 88, and a frequency divider 89 that frequency-divides the local oscillation signal from the oscillator 1.

The signal processing unit 65 includes a transmission processing function, a reception processing function, and a function of performing processing of a media access control MAC) layer or a host network hierarchy thereof.

The radio communication device 63 including the receiving circuit 61 and the transmitting circuit 62 in FIG. 7 each being a single body, may be provided.

The radio communication device 63 in FIG. 7 includes only the one antenna unit 80, but the number of the antennas is not particularly limited. For example, a transmission antenna unit 80 and a reception antenna unit 80 may be separately provided or an I signal antenna unit 80 and a Q signal antenna unit 80 may be separately provided. When only one antenna unit 80 is provided, a transmission-and-reception changeover switch at least switches the transmission and the reception.

The radio communication device 63 illustrated in FIG. 7 can be applied to a stationary radio communication device 63, such as an access point, a wireless router, or a computer, can be applied to a portable radio terminal, such as a smartphone or a mobile phone, can be applied to peripheral equipment, such as a mouse or a keyboard, that performs radio communication with a host device, can be applied to a card-typed member including a radio function built therein, or can be applied to a wearable terminal that performs radio communication of biological information. Various examples of a radio system of the radio communication between the radio communication devices 63 illustrated in FIG. 7 are not particularly limited. The radio communication device according to the present embodiment is applicable to third generation or later cellular communication, a wireless LAN, Bluetooth (registered trademark), and near-field radio communication.

Figure 8:
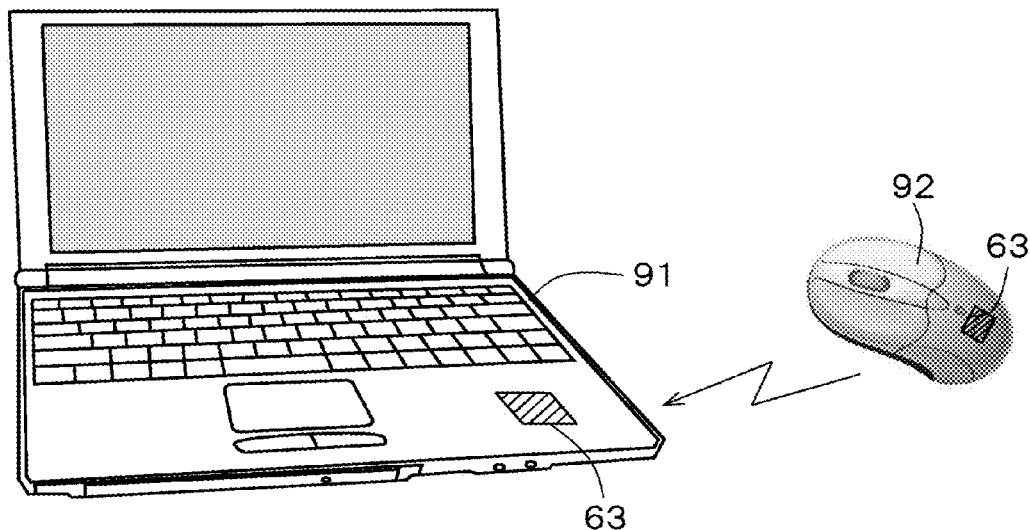
FIG. 8 is a view of an example of radio communication performed between a PC and a mouse.

FIG. 8 illustrates exemplary performance of radio communication between a PC 91 being a host device and a mouse 92 being peripheral equipment. Both of the PC 91 and the mouse 92 include the radio communication device 63 illustrated in FIG. 7 built therein. The mouse 92 uses power of a built-in battery so as to perform the radio communication, and is required to perform the radio communication with power consumption as low as possible because a space in which the battery is built is limited. Accordingly, it is preferable to perform the radio communication by using a radio system capable of low consumption radio communication, such as Bluetooth Low Energy defined in a standard of Bluetooth (registered trademark) 4.0.

Figure 9:
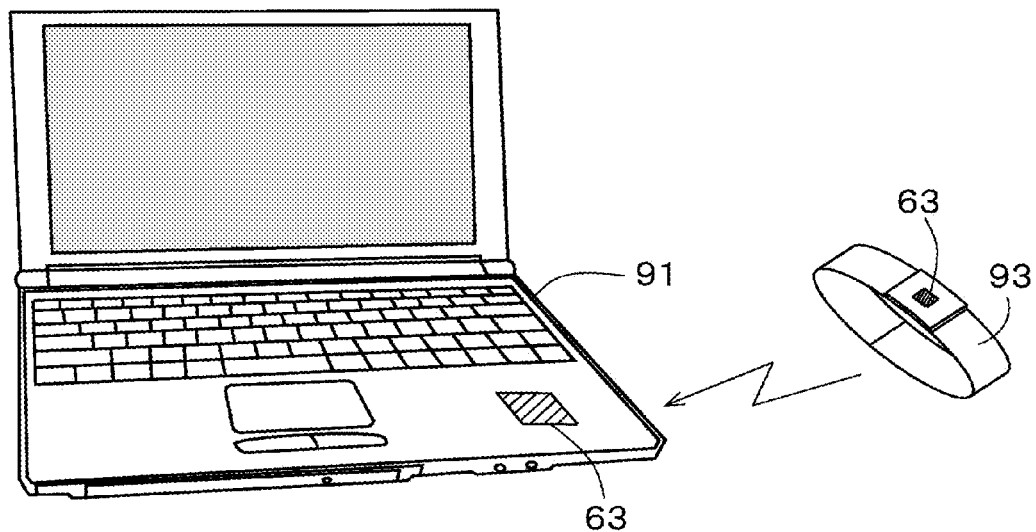
FIG. 9 is a view of an example of radio communication performed between the PC and a wearable terminal.

FIG. 9 illustrates exemplary performance of radio communication between a wearable terminal 93 and a host device (for example, the PC 91). The wearable terminal 93 is to be worn on a body of a person, and various examples thereof may include a seal type to be worn on a body, an eyeglasses type and an earphone type to be worn on a body except arms, and a pacemaker to be inserted inside a body, in addition to a type to be worn on an arm illustrated in FIG. 9. Both of the wearable terminal 93 and the PC 91 in FIG. 9 also include the radio communication device 63 illustrated in FIG. 7 built therein. Note that, examples of the PC 91 include a computer and a server. The above radio system capable of the radio communication with low power consumption, such as Bluetooth Low Energy, is also preferably adopted because the wearable terminal 93 is worn on a body of a person and a space for a built-in battery is limited.

When the radio communication is performed between the radio communication devices 63 illustrated in FIG. 7, the type of information to be transmitted and received through the radio communication is not limited. Note that, the radio system is preferably varied between a case where information including a large amount of data, such as moving image data, is transmitted and received and a case where information including a small amount of data, such as operation information of the mouse 92, is transmitted and received. Thus, there is a need to perform the radio communication in an optimum radio system in response with the amount of information to be transmitted and received.

Furthermore, when the radio communication is performed between the radio communication devices 63 illustrated in FIG. 7, a notifying unit that notifies a user of an operation state of the radio communication, may be provided. Specific examples of the notifying unit may include display of the operation state on a display device including LEDs, notification of the operation state by vibration of a vibrator, and notification of the operation state from audio information by a speaker or a buzzer.

At least one unit of the oscillators 1 and the radio communication devices 63 described in the above respective embodiments, may include hardware or may include software. When the configuration including the software is provided, a program for achieving a function of the at least one unit of the oscillators 1 and the radio communication devices 63, may be stored in a storage medium, such as a flexible disk or a CD-ROM, and then may be read and performed by a computer. The storage medium is not limited to a detachably attachable storage medium, such as a magnetic disk or an optical disc, and may be a non-removable storage medium, such as a hard disk or a memory.

The program for achieving the function of the at least one unit of the oscillators 1 and the radio communication devices 63, may be distributed through a communication line, such as the Internet, (including radio communication). Furthermore, the program that has been encrypted, modulated, or compressed, may be distributed through a wired line or a wireless line, such as the Internet, or may be stored in a storage medium and then may be distributed.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. An oscillator comprising:
   an oscillator which comprises a first variable capacitor to adjust capacitance based on a first signal and a second variable capacitor to adjust capacitance based on a second signal, generates an oscillation signal having a frequency in accordance with the capacitance of the first variable capacitor and the second variable capacitor;
   an integer phase detector to detect an integer phase of the oscillation signal;
   a fractional phase detector to detect a fractional phase of the oscillation signal based on a third signal as a reference and the oscillation signal;
   a phase error generator to generate a fourth signal indicating a phase error of the oscillation signal, based on the integer phase, the fractional phase, and a frequency control signal;
   a first filter to extract the first signal in a predetermined frequency band, included in the fourth signal, and to output the first signal in asynchronization with the third signal; and
   a second filter to extract the second signal in a predetermined frequency band, included in the fourth signal, and to output the second signal in synchronization with the third signal.

2. The oscillator according to claim 1,
   wherein the capacitance of the first variable capacitor is smaller than the capacitance of the second variable capacitor.

3. The oscillator according to claim 1,
   wherein the first variable capacitor comprises a plurality of first capacitive elements coupled in parallel and a plurality of first switches that is individually coupled in series with each of the first capacitive elements and is turned on or off with the first signal, and
   the second variable capacitor comprises a plurality of second capacitive elements coupled in parallel and a plurality of second switches that is individually coupled in series with each of the second capacitive elements and is turned on or off with the second signal.

4. The oscillator according to claim 1,
   wherein the oscillator, the integer phase detector, the fractional phase detector, the phase error generator, the first filter, and the second filter, include digital circuitry.

5. The oscillator according to claim 1, further comprising a timing adjusting unit to generate a fifth signal comprising the amount of delay of the first signal adjusted,
   wherein the first variable capacitor adjusts the capacitance based on the fifth signal.

6. The oscillator according to claim 1,
wherein the second filter includes:
a filtering unit to extract a signal in the predetermined frequency band, included in the fourth signal; and
a synchronizing unit to synchronize the signal output from the filtering unit with the third signal so as to generate the second signal.

7. The oscillator according to claim 1, further comprising:
a phase error determiner to determine whether an absolute value of the phase error exceeds a predetermined value, based on the fourth signal; and
a controller which does not perform the adjustment of the capacitance of the first variable capacitor with the first signal and performs the adjustment of the capacitance of the second variable capacitor with second signal so as to control the frequency of the oscillation signal until the phase error determiner determines that the predetermined value has been exceeded, and performs the adjustment of the capacitance of the first variable capacitor with the first signal and the adjustment of the capacitance of the second variable capacitor with second signal so as to control the frequency of the oscillation signal when the phase error determiner determines that the predetermined value has been exceeded.

8. The oscillator according to claim 1, further comprising
an integrated circuit comprising the oscillator, the integer phase detector, the fractional phase detector, the phase error generator, the first filter, and the second filter.

9. The oscillator according to claim 1, further comprising at least one antenna.

10. A radio communication device comprising:
an RF unit comprising a transmitting circuit and a receiving circuit; and
a baseband unit comprising a transmission processing circuit and a reception processing circuit,
wherein the receiving circuit comprises:
an oscillator which comprises a first variable capacitor to adjust capacitance based on a first signal and a second variable capacitor to adjust capacitance based on a second signal, generates an oscillation signal having a frequency in accordance with the capacitance of the first variable capacitor and the second variable capacitor;
an integer phase detector to detect an integer phase of the oscillation signal;
a fractional phase detector to detect a fractional phase of the oscillation signal based on a third signal as a reference and the oscillation signal;
a phase error generator to generate a fourth signal indicating a phase error of the oscillation signal, based on the integer phase, the fractional phase, and a frequency control signal;
a first filter to extract the first signal in a predetermined frequency band, included in the fourth signal, and to output the first signal in asynchronization with the third signal; and
a second filter to extract the second signal in a predetermined frequency band, included in the fourth signal, and to output the second signal in synchronization with the third signal.

11. The radio communication device according to claim 10,
wherein the capacitance of the first variable capacitor is smaller than the capacitance of the second variable capacitor.

12. The radio communication device according to claim 10,
wherein the first variable capacitor comprises a plurality of first capacitive elements coupled in parallel and a plurality of first switches that is individually coupled in series with each of the first capacitive elements and is turned on or off with the first signal, and
the second variable capacitor comprises a plurality of second capacitive elements coupled in parallel and a plurality of second switches that is individually coupled in series with each of the second capacitive elements and is turned on or off with the second signal.

13. The radio communication device according to claim 10,
wherein the oscillator, the integer phase detector, the fractional phase detector, the phase error generator, the first filter, and the second filter, include digital circuitry.

14. The radio communication device according to claim 10, further comprising
a timing adjusting unit to generate a fifth signal comprising the amount of delay of the first signal adjusted,
wherein the first variable capacitor adjusts the capacitance based on the fifth signal.

15. The radio communication device according to claim 10,
wherein the second filter includes:
a filtering unit to extract a signal in the predetermined frequency band, included in the fourth signal; and
a synchronizing unit to synchronize the signal output from the filtering unit with the third signal so as to generate the second signal.

16. The radio communication device according to claim 10, further comprising:
a phase error determiner to determine whether an absolute value of the phase error exceeds a predetermined value, based on the fourth signal; and
a controller which does not perform the adjustment of the capacitance of the first variable capacitor with the first signal and performs the adjustment of the capacitance of the second variable capacitor with second signal so as to control the frequency of the oscillation signal until the phase error determiner determines that the predetermined value has been exceeded, and performs the adjustment of the capacitance of the first variable capacitor with the first signal and the adjustment of the capacitance of the second variable capacitor with second signal so as to control the frequency of the oscillation signal when the phase error determiner determines that the predetermined value has been exceeded.

17. The radio communication device according to claim 10, further comprising
an integrated circuit comprising the oscillator, the integer phase detector, the fractional phase detector, the phase error generator, the first filter, and the second filter.

18. The radio communication device according to claim 10, further comprising
at least one antenna.

19. A radio communication method comprising:
generating an oscillation signal having a frequency in accordance with of capacitance of a first variable capacitor that adjusts the capacitance based on a first signal and a second variable capacitor that adjusts the capacitance based on a second signal;
detecting an integer phase of the oscillation signal;
detecting a fractional phase of the oscillation signal based on a third signal as a reference and the oscillation signal;

generating a fourth signal indicating a phase error of the oscillation signal, based on the integer phase, the fractional phase, and a frequency control signal;

extracting the first signal in a predetermined frequency band, included in the fourth signal so as to output the first signal in asynchronization with the third signal; and extracting the second signal in a predetermined frequency band, included in the fourth signal so as to output the second signal in synchronization with the third signal.

20. The radio communication method according to claim 19, wherein the capacitance of the first variable capacitor is smaller than the capacitance of the second variable capacitor.

* * * * *